United States Patent [19]

Ryu

[11] Patent Number: 4,667,178

[45] Date of Patent: May 19, 1987

[54] DIGITAL TO ANALOG CONVERTER

[75] Inventor: Kazuo Ryu, Tokyo, Japan

[73] Assignee: NEC Corporation, Japan

[21] Appl. No.: 571,271

[22] Filed: Jan. 16, 1984

[30] Foreign Application Priority Data

Jan. 18, 1983 [JP] Japan .................................. 58-6004

[51] Int. Cl.[4] ............................................. H03M 1/68
[52] U.S. Cl. ....................340/347 DA; 340/347 AD
[58] Field of Search ................. 340/347 DA, 347 AD

[56] References Cited

U.S. PATENT DOCUMENTS 4,146,882  3/1979  Hoff ............................ 340/347 DA
4,293,848 10/1981  Cheng ........................ 340/347 AD
4,366,470 12/1982  Takanashi .................... 340/347 DA Primary Examiner—Charles D. Miller
Attorney, Agent, or Firm—Sughrue, Mion, Zinn, Macpeak, and Seas

[57] ABSTRACT

A digital to analog converter is disclosed which can operate with a high accuracy and can be fabricated at a highly integrated structure.

The converter comprises a voltage divider circuit dividing a reference voltage into a plurality of divided voltages, a plurality of P-channel field effect transistor switches for selectively extracting a higher potential part of the divided voltages and a plurality of N-channel field effect transistor switches for selectively extracting a lower potential part of the divided voltages, wherein both of P-channel and N-channel transistors operate in a triode-region.

4 Claims, 6 Drawing Figures

DIGITAL TO ANALOG CONVERTER

BACKGROUND OF THE INVENTION

1. Field of the Invention

The present invention relates to digital to analog converter (D/A converter) for converting a digital signal to an analog signal, and more particularly to that fabricated by MOS technology.

2. Description of the Prior Art

It has been desired that a D/A converter as interface means for a microcomputer or the like operates by a single power supply which is shared with the microcomputer. The U.S. Pat. No. 4,293,848 discloses a D/A converter which is fabricated with MOS technology and operates with a single power supply. This D/A converter is suitable to be integrated on a silicon substrate together with a microcomputer and is composed of a reference voltage terminal for supplying the voltage of the single power supply as a reference voltage, a series circuit of a plurality of series-connected dummy resistors and a plurality of series-connected functional resistors between the reference voltage terminal and a ground terminal, a plurality of MOS transistor switches connected respectively to the junction points of the functional resistors, and means for selectively applying a switching signal to the gate electrodes of the MOS transistor switches. The potential at the node between the series-connected dummy resistors and the series-connected functional resistors is made to be one half of the reference voltage, which is divided by the functional resistors, and one of the divided voltages appearing at the respective junction points of the functional resistors is extracted as an analog output via the selected MOS transistor switch in response to the switching signal which is dependent on a digital input. The power supply voltage ($V_{DD}$) is used as the reference voltage ($V_{REF}$), and the switching signal has a level of the power supply voltage to make the selected MOS transistor conductive. Since the maximum of the divided voltages is $\frac{1}{2} V_{DD}$, the potential of the switching signal ($V_{DD}$) is far larger than the divided voltage to be transmitted through any of the MOS transistors and therefore all the MOS transistors can operate in a triode region, i.e., nonsaturated region. Accordingly, the selected one of the divided voltages can be outputted through the MOS transistor without any level reduction.

However, the maximum value of the analog output is limited to one half of the power voltage ($V_{DD}$) and the range of the divided voltages is narrow. In addition, a noise component in the outputted voltage is not reduced to one half as compared to the case where the maximum value of the divided voltage is the power voltage $V_{DD}$. As a result, dynamic range in the D/A conversion is small. This raises a problem in accuracy when a more accurate D/A converter is to be fabricated. Moreover, the area for the dummy resistors increases the area of the D/C converter integrated circuit by a factor of about two, which is one reason why the cost of fabricating the converter is high.

SUMMARY OF THE INVENTION

An object of the present invention is to provide a D/A converter which can accurately convert a digital input signal to an analog signal.

Another object of the present invention is to provide a D/A converter which can be fabricated in a small size.

The present invention is featured by the use of P-channel MOS transistors and N-channel MOS transistors as switches for extracting the divided voltages from a resistance-dividing circuit with the P-channel and N-channel MOS transistors operating in an unsaturated region, i.e., the triode region, so that the reference voltage itself can be employed as the maximum of the divided voltages.

In the present invention, those of the divided voltages which are equal to or higher than a level ($V_H - V_{TN}$), where $V_H$ represents a high level of the switching signal and $V_{TN}$ is a threshold value of the N-channel transistor are extracted through the P-channel transistors, whereas those of the divided voltages which are equal to or lower than a level ($V_L + V_{TP}$), where $V_L$ represents a low level of the switching signal and $V_{TP}$ is a threshold value of the P-channel transistor are extracted through the N-channel transistors. The divided voltages less than the level ($V_H - V_{TN}$) and more than the level ($V_L + V_{TP}$) are extracted through either the N-channel transistors or the P-channel transistors.

According to the present invention, any divided voltage can be extracted without any reduction in level, while the range of the divided voltages is widen. This makes it possible to provide a highly accurate D/A converter.

According to one aspect of the present invention, a resistor circuit is provided between a full-scale voltage $V_{REF}$ and a ground potential to generate a plurality of divided voltages, and N-channel field effect transistors extract the divided voltages of values less than one half of a full-scale voltage $V_{REF}$, while P-channel field effect transistors extract voltages higher than $\frac{1}{2} V_{REF}$. The series resistor circuit may be favorably arranged in a folded pattern.

DESCRIPTION OF THE PREFERRED EMBODIMENT

Figure 1:
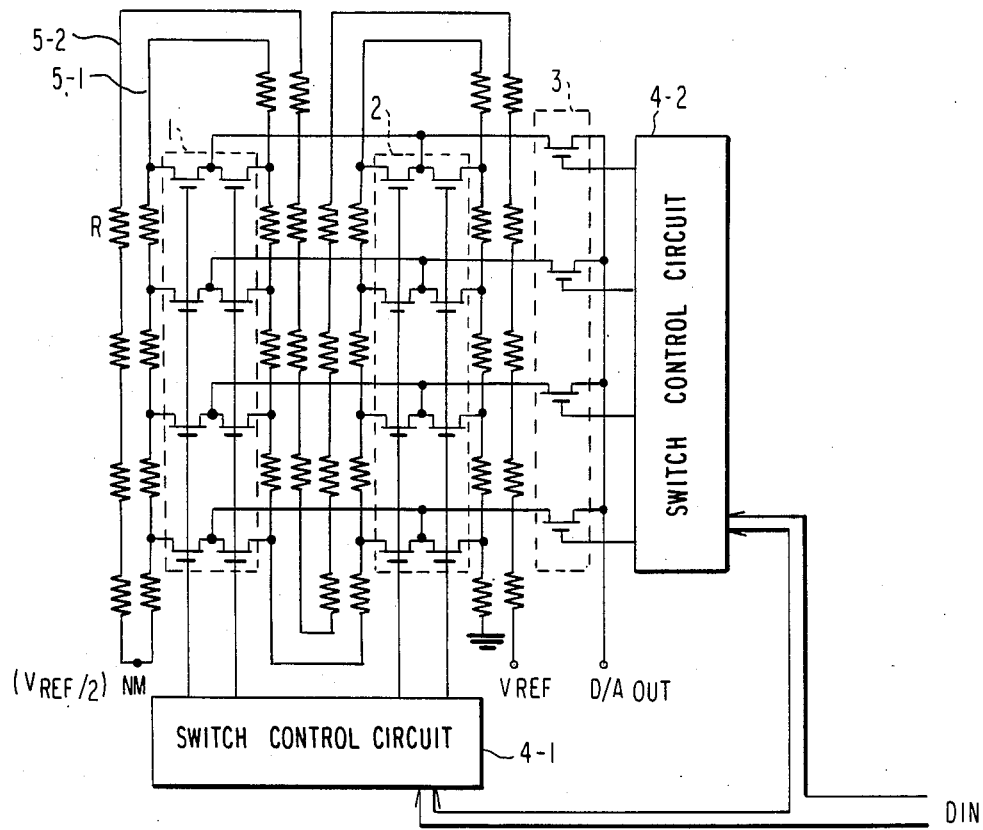
FIG. 1 is a circuit diagram of a D/A converter according to the prior art.

The prior art D/A converter disclosed in the above-mentioned U.S. patent will now be described with reference to FIG. 1.

A functional resistor circuit 5-1 which is composed of series-connected resistors each having a resistance R is connected between a ground potential and an intermediate node $N_M$, and a dummy resistor circuit 5-2 of series-connected resistors each having a resistance R is connected between the intermediate node $N_M$ and a reference voltage $V_{REF}$, thus forming a resistance network circuit. In this structure, the potential at the node $N_M$ is one half of $V_{REF}$. The dummy resistor circuit 5-2 is provided to divide the reference voltage $V_{REF}$ by one-half. Switch network circuits 1, 2 and 3 composed of MOS transistors are controlled by switch control circuits 4-1 and 4-2 receiving digital input signals $D_{IN}$. One of voltages divided, by the functional resistor circuit 5-1 is outputted through one of the MOS transistors in the switch networks 1 and 2 which is selected by one of the MOS transistors in the switch network 3 which is selected by the control circuit 4-2, to an analog output terminal D/C OUT.

When the transistors forming the circuits 1, 2 and 3 are N-channel MOS (N MOS) transistors, it is not made conductive (turned on) until the voltage applied to its gate reaches a level which is higher than the potential of its source electrode by at least the threshold voltage thereof. If the D/A converter of FIG. 1 does not have the dummy resistor circuit 5-2 to enhance the maximum value (the potential at the node $N_M$) to the reference voltage $V_{REF}$, it is therefore necessary to drive the gates of the MOS transistors of the switch circuits 1, 2 and 3, if they are N MOS transistors, by a voltage higher than the reference voltage. Since the power supply voltage is used as the reference voltage, this necessitates a bootstrap circuit for generating such higher voltage, which in turn necessitates a considerable substrate area. In the D/A converter of FIG. 1, therefore, the maximum reference voltage $V_{REF}$ is divided into one half by the dummy resistor circuit 5-2, instead of driving the gates of the switches with the bootstrap circuit. Owing to this circuit construction, the D/A converter achieves a digital to analog conversion with a maximum analog signal of $\frac{1}{2} V_{REF}$. Therefore, the maximum output analog signal is limited to one half of the power supply. Further, this also lowers conversion accuracy. Moreover, the area needed for the dummy resistor circuit 5-2 is approximately the same as that for the functional resistor circuit, so that the cost of fabricating such a D/A converter is increased.

A D/A converter according to one embodiment of the present invention will be described below with reference to FIG. 2.

Figure 2:
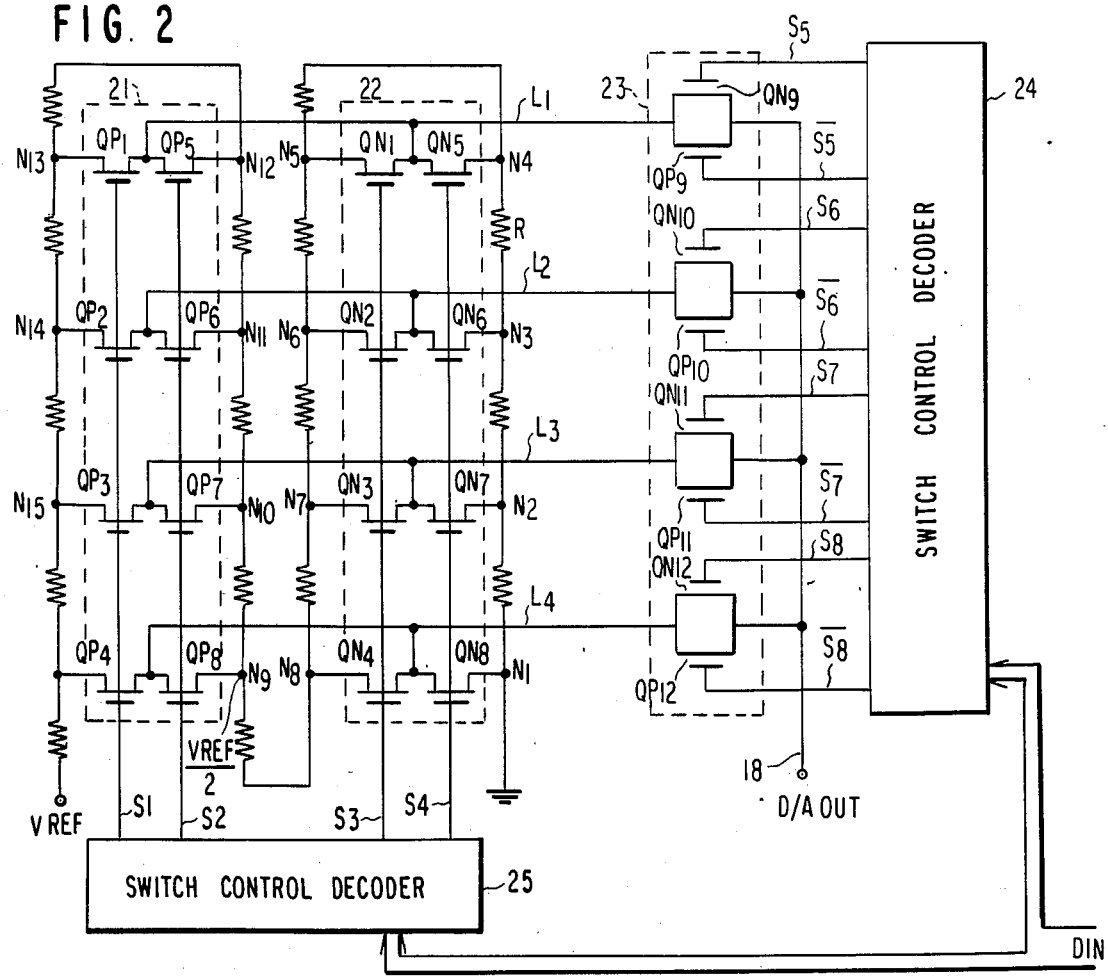
FIG. 2 is a block diagram of a D/A converter according to one embodiment of the present invention.

FIG. 2 shows a D/A converter according to the present invention. Digital data input $D_{IN}$ of a plurality of bits is applied to decoder circuits 24 and 25. Four pairs of select lines ($S_5$, $\overline{S_5}$) to ($S_8$, $\overline{S_8}$) are derived from the decoder 24, while four select lines $S_1$ to $S_4$ are derived from the decoder 25. In this D/A converter, a predetermined number of resistors each having a resistance R are connected in series between the ground potential and a reference voltage $V_{REF}$ to construct a series resistor circuit. A switch circuit 21 is connected to voltage-dividing points $N_9$ to $N_{16}$ for extracting a divided voltage of half the value of the reference voltage $V_{REF}$ at $N_9$ or a divided voltage of more than $\frac{1}{2} V_{REF}$ and less than $V_{REF}$ at $N_{10}$ to $N_{16}$. This circuit 21 is constructed of P-channel MOS (PMOS) transistors $Q_{p1}$ to $Q_{p8}$ arranged in first and second columns. On the other hand, a switch circuit 22, which is connected to voltage-dividing points $N_1$ to $N_8$ for extracting one of the divided voltages in the range lower than the value of $\frac{1}{2} V_{REF}$ and not less than zero, is constructed of N-channel (N MOS) transistors $Q_{N1}$ to $Q_{N8}$ arranged in third and fourth columns. Gates of the P-channel transistors $Q_{p1}$ to $Q_{p4}$ are connected in common to the selection line $S_1$. Gates of the P-channel transistors $Q_{p5}$ to $Q_{p8}$ are connected to the selection line $S_2$. Similarly, gates of the N-channel transistors $Q_{N1}$ to $Q_{N4}$ and the gates of the N-channel transistors $Q_{N5}$ to $Q_{N8}$ are connected to the selection lines $S_3$ and $S_4$, respectively. Among those transistors $Q_{p1}$ to $Q_{p8}$ and $Q_{N1}$ to $Q_{N8}$ arranged in first to fourth columns, those in a selected one column are made conducting by making one of the selection lines $S_1$ to $S_4$ a selective level. Here, the selective level of the selection lines $S_1$ and $S_2$ is the ground potential while the selective level of the selection lines $S_3$ and $S_4$ is the power supply voltage, e.g. $V_{REF}$.

Four internal lines $L_1$ to $L_4$ are arranged in row direction. The line $L_1$ is arranged in a first row and connected to the four transistors $Q_{p1}$, $Q_{p5}$, $Q_{N1}$ and $Q_{N5}$. The line $L_2$ is arranged in a second row and connected to the four transistors $Q_{p2}$, $Q_{p6}$, $Q_{N2}$ and $Q_{N6}$. Similarly, the lines $L_3$ and $L_4$ are arranged in third and fourth rows and connected to the four transistors $Q_{p3}$, $Q_{p7}$, $Q_{N3}$ and $Q_{N7}$ and the four transistors $Q_{p4}$, $Q_{p8}$, $Q_{N4}$ and $Q_{N8}$, respectively. In this structure, when the selection line $S_2$ is selected, the four transistors $Q_{p5}$ to $Q_{p8}$ are conducting to connect the four lines $L_1$ to $L_4$ to the four dividing points $N_{12}$ to $N_9$, respectively. Then, among the four lines $L_1$ to $L_4$, a selected one is connected to the output terminal D/A OUT via a selection circuit 23 controlled by the decoder 24, to extract the divided voltage at the selected one of the nodes $N_{12}$ to $N_9$ to the output terminal.

The reason why the selection circuit 21 is composed of P-channel transistors while the selection circuit 22 is composed of N-channel transistors is as follows. A PMOS transistor operates in the unsaturated region, i.e., the triode region, to output a voltage without any attenuation in level when its gate potential is lower than its source potential by its threshold value, whereas an NMOS transistor operates in the unsaturated region when its gate potential is higher than its source potential by its threshold value. The gate control voltage of these PMOS and NMOS transistors is switched between 0 V and a power supply voltage $V_{REF}$ or higher. The selection of the divided voltages in the range from $V_{REF}$ to $\frac{1}{2} V_{REF}$ can be conducted very effectively by PMOS transistors when they have gate voltages of 0 V, so long as the absolute value of the threshold voltages of the PMOS transistors is at least $\frac{1}{2} V_{REF}$. For example, a switching occurs when the reference voltage $V_{REF}$ is 5 V and when the voltages of the selecting lines $S_1$ to $S_4$ and ($S_5$, $\overline{S_5}$) to ($S_8$, $\overline{S_8}$) are at 0 V to 5 V, and the threshold values of the N MOS and P MOS transistors are 0.8 V and $-0.8$ V, respectively.

Since the switch circuit 23 is supplied through internal lines $L_1$ to $L_4$ with both a divided voltage at a high potential which is extracted through the switch circuit 21 and a divided voltage at a low potential which is extracted through the switch circuit 22, the individual switches are constructed of parallel circuits of N MOS and P MOS transistors, which are controlled true and complementary signals.

The operations of this D/A converter will be described below. Assume that the divided potential of the node $N_7$ is extracted to the output D/A OUT. In this case, the level of a selection line $S_3$ goes high to turn the N MOS transistors $Q_{N3}$ on. The selection lines $S_1$ and $S_2$ go high and the selection line $S_4$ goes low to turn off all the transistors connected to the selection lines not selected. Among selection lines from a control circuit 24, a line $S_7$ goes high and a line $\overline{S_7}$ goes low to turn an N MOS transistor $Q_{N11}$ and the P MOS transistor $Q_{p11}$ on, and thus connect the extraction line $L_3$ to the output terminal D/A OUT.

According to the switch construction thus far described, the voltage driving the gates of the tap-selecting switches in the circuits 21 and 22 can cover the range between zero to the power supply voltage, thus making a bootstrap circuit unnecessary. Moreover, the analog switch 23 for introducing the tap voltage to an output line 18 is constructed by connecting P MOS transistors and N MOS transistors in parallel, so that any tap potential from zero to full scale can introduced without fail to the output line 18. Switch control circuits 24 and 25 control the selection of the taps in response to the digital input signal $D_{IN}$ and are constructed of standard logic elements.

By using the so-called "CMOS construction", analog signals within a wide range from 0 V to full scale can be output without the need of either a dummy resistor circuit as in the previous A/D converter or a bootstrap circuit. Incidentally, although FIG. 2 shows the case of a four-bit digital input, a similar construction is effective for inputs of any number of bits.

The D/A converter according to the present invention may be employed in an A/D converter. One example will now be described with reference to FIG. 3.

Figure 3:
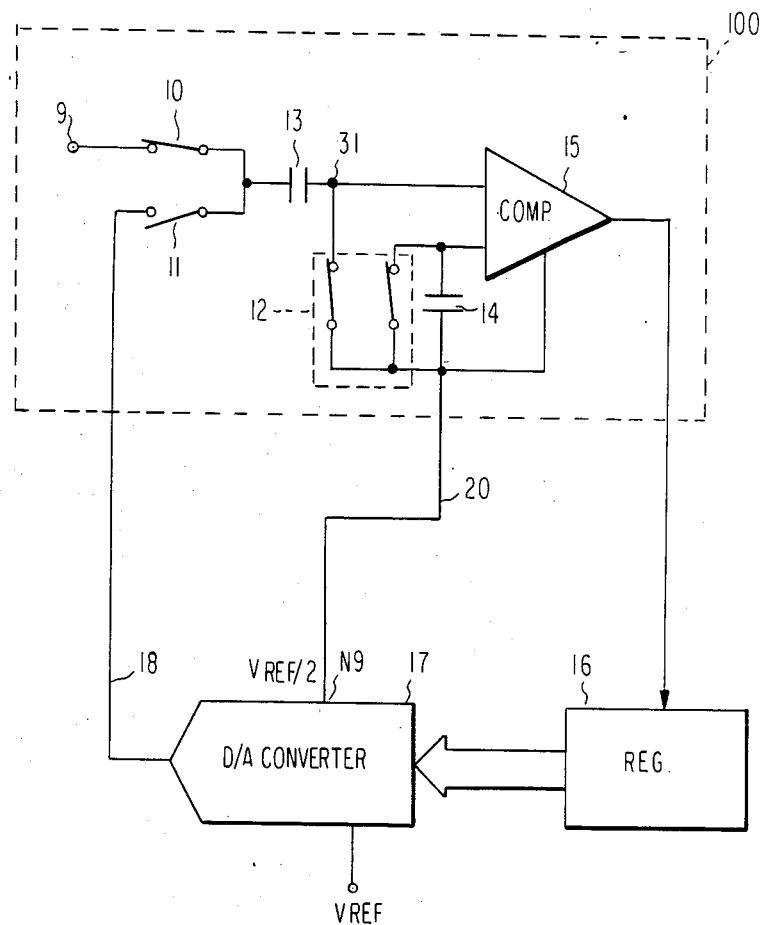
FIG. 3 is a circuit diagram of an A/D converter employing the D/A converter of the present invention.

The D/A converter 17 has the construction shown in FIG. 2, and the output of a successive comparison register 16 is applied as a digital input $D_{IN}$, to the circuits 24 and 25 (FIG. 2) of the D/A converter 17. An analog input signal in FIG. 3 is supplied to a terminal 9 and is applied to one electrode of a capacitor 13 through a switch 10. At the same time, the other electrode of the capacitor 13 is biased to the potential $\frac{1}{2} V_{REF}$ from the D/A converter 17 by a switch 12. When the switches 10 and 12 in a comparator section 100 are turned off and a switch 11 turned on, the analog input signal is held in the capacitor 13, and a successive approximation algorithm is started. The analog input signal held in the capacitor 13 is compared with the reference signal from the D/A converter 17, which starts at one half of full scale. In the D/A converter of FIG. 2, the reference signal of $\frac{1}{2}$ full scale corresponds to $\frac{1}{2} V_{REF}$. When the result of the comparison indicates that the input analog signal is higher than the reference signal, the successive comparison resistor 16 sets the output signal from the D/A converter 17 to three quarters of full scale. When the comparison result indicates that the input analog signal is lower than the first reference signal, the resistor 16 sets the output signal from the D/A converter 17 to a quarter of full scale. These successive approximation operations continue until a successive comparison resistor identifies the digital signal equal to the input analog signal.

In FIG. 3, a common line 20 is connected to the node $N_9 (\frac{1}{2} V_{REF})$ of the D/A converter 17. This is because if the line 20 had a potential lower than $\frac{1}{2} V_{REF}$, a node 31 would have a negative potential if the analog input signal is equal to $\frac{1}{2} V_{REF}$, so that a forward current would flow between the P-well region and the N-type diffusion region forming the N-channel MOS FET of the switch 12, and the charge held in the capacitor would fluctuate to reduce the conversion accuracy. If the potential of the line 20 was higher than $\frac{1}{2} V_{REF}$, on the other hand, a voltage higher than $V_{REF}$, i.e., the power supply voltage, flows through the node 31 when the analog input signal is zero. The disadvantage of this comparator section 100 is that the charge held in the capacitor of the sample-and-hold circuit of the preceding stage leaks with the charge and discharge of a parasitic capacitor when the feedback switch is turned on and off, namely, so-called "step errors" occur. This tends to reduce the conversion accuracy of the A/D converter. An improved comparator section 100′ avoiding the avove disadvantage is shown in FIG. 4, in which the step errors generated by turning on and off the switch 12 are compensated for by connecting a capacitor of a shape identical to that of the hold capacitor 13 between its inverted input terminal and the line 20.

Figure 4:
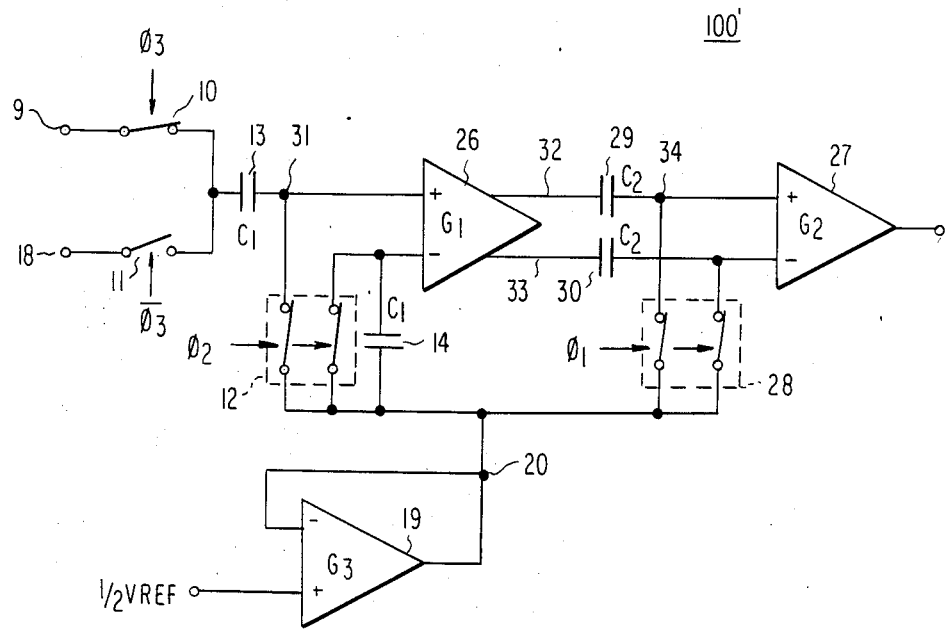
FIG. 4 is a block diagram of an improved sample-and-hold circuit and comparator used in the circuit of FIG. 3.
Figure 6:
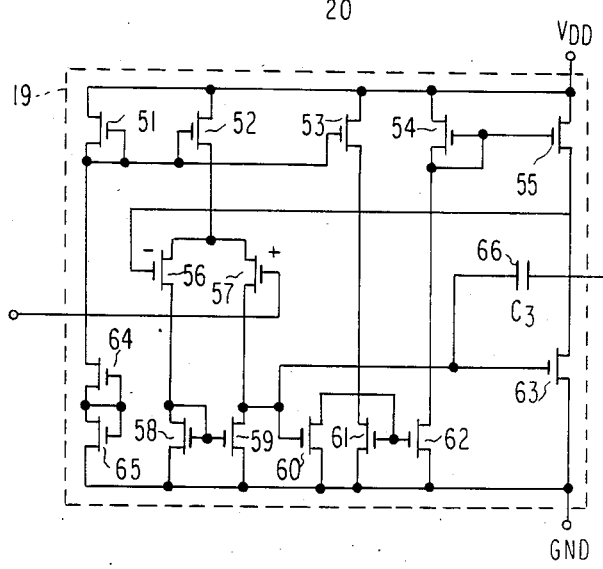
FIG. 6 is a timing chart of the operations of the circuits of FIGS. 4 and 5.
Figure 6:
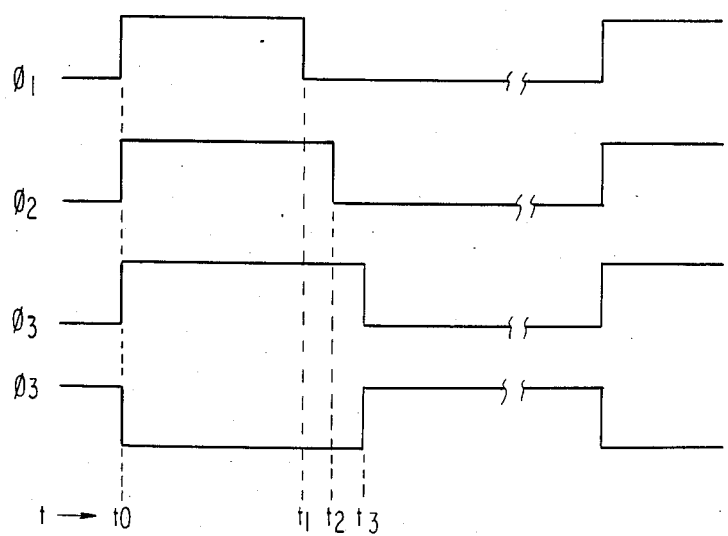

In FIGS. 4 and 6, at a time $t_0$, switches 10, 12 and 28 are turned on, and switch 11 is turned off. If the input offset voltage of a differential amplifier 26 is $e_1$, the d.c. bias voltages of output terminals 32 and 33 is $V_0$, and the bias voltage of the bus 20 is $V_B$, a charge of $(\frac{1}{2} e_1 \cdot G_1 + V_0 - V_B) \cdot C_2$ is held in a capacitor 29, and a charge of $(\frac{1}{2} e_1 \cdot G_1 + V_0 - V_B) \cdot C_2$ is held in a capacitor 30. If the voltage of the analog input signal is $V_{IN}$, a charge of $(V_{IN} - V_B) \cdot C_1$ is held in the capacitor 13. $G_1$ designates the voltage gain of the differential amplifier 26. Next, the switch 28 is turned off at a time $t_1$ ($\phi_1$ in FIG. 6), the switch 12 is turned off at a time $t_2$ ($\phi_2$ in FIG. 6), and finally ($\phi_3$ in FIG. 6) the switch 10 is turned off, and the switch 11 simultaneously turned on. The charges held in each of the capacitors can be prevented from leaking by staggering the times at which the corresponding switches are turned off. As a result, the potential of the node 31 is expressed by $(V_{DAC} - V_{IN} + V_B)$, if the reference output voltage from the D/A converter is $V_{DAC}$. During the successive approximation operations, therefore, the first output of the D/A converter is expressed by $V_{DAC} = \frac{1}{2} V_{REF}$ so that the potential of the node 31 has the value of $(-\frac{1}{2} V_{REF} + V_B)$ for the analog input signal $V_{IN} = V_{REF}$. If the bias voltage was set by the inequality $V_B < \frac{1}{2} V_{REF}$, a negative voltage would be generated at the node 31 so that a forward current would flow between the P-well region and the N-type electrode diffusion region of the switch 12, so that the charge held in the capacitor 13 would fluctuate to reduce the conversion accuracy. If the bias voltage was set by the inequality $V_B > \frac{1}{2} V_{REF}$, on the other hand, a voltage higher than $V_{REF}$, i.e., the power supply voltage, would be generated at the node 31 when the analog input signal is zero, so that a foward current flows between the P-type electrode diffusion region and the N-type substrate of the switch 12, so that the charge stored in the capacitor 13 would leak. By setting the bias voltage according to the equation $V_B = \frac{1}{2} V_{REF}$, consequently, no forward current through the switch 12 is generated at any level of analog input signal between zero and $V_{REF}$ so that the charge held initially in the capacitor 13 is held securely until the successive approximation operations are complete.

The voltage at the output terminal 32 of the differential amplifier 26 is $\frac{1}{2} (V_{DAC} - V_{IN} + e_1) \cdot G_1 + V_0$, and the voltage at the output terminal 33 is $-\frac{1}{2} (V_{DAC} - V_{IN} + e_1) \cdot G_1 + V_0$. Since charges of $(\frac{1}{2} e_1 \cdot G_1 + V_0 - V_B) \cdot C_2$ and $(-\frac{1}{2} e_1 \cdot G_1 + V_0 - V_B) \cdot C_2$ are held in the capacitors 29 and 30, respectively, nodes 34 and 35 have corresponding potentials of $$\frac{1}{2} (V_{DAC} - V_{IN}) \cdot G_1 + V_B \text{ and } -\frac{1}{2} (V_{DAC} - V_{IN}) \cdot G_1 + V_B.$$

On the other hand, the voltage amplitudes of the output terminals 32 and 33 are between zero to the power supply voltage ($V_{DD}$) as a maximum, so that a maximum dynamic range can be obtained for the output terminals by setting the d.c. bias voltage $V_0$ of the output terminals at $\frac{1}{2} V_{DD}$ (usually equal to $\frac{1}{2} V_{REF}$). Since the value of $\pm\frac{1}{2} (V_{DAC}-V_{IN})\cdot G_1$ can be suppressed within a range of $\pm\frac{1}{2} V_{DD}$ about the mid-point of $\frac{1}{2} V_{DD}$, moreover, the potentials at the nodes 34 and 35 are expressed by the following equations, if $V_{DD}=V_{REF}$:

$$\frac{1}{2}(V_{DAC}-V_{IN})\cdot G_1 + V_B = \frac{1}{2} V_{REF} + V_B = V_{REF},$$

and $$-\frac{1}{2}(V_{DAC}-V_{IN})\cdot G_1 + V_B = -\frac{1}{2} V_{REF} + V_B = 0,$$

so that the potentials at these nodes can be suppressed within the range between zero to the power supply voltage, even if the output terminals 32 and 33 are at the maximum amplification.

The potential difference between the nodes 34 and 35 is expressed by $(V_{DAC}-V_{IN})\cdot G_1$, and the input offset voltage $e_1$ of the differential amplifier 26 is compensated for at the input terminal of a differential amplifier 27. If the input offset voltage of the differential amplifier 27 is $e_2$, and if the voltage gain of that amplifier is $G_2$, it is understood that the output voltage $V_{OUT}$ of the amplifier 27 can be expressed by:

$$V_{OUT} = G_2 \cdot [G_1 \cdot (V_{DAC} - V_{IN}) + e_2]$$

$$= G_1 \cdot G_2 \cdot [(V_{DAC} - V_{IN}) + e_2/G_1]$$

so that the input offset voltage of that comparator has the value of $e_2/G_1$. As a result, by increasing the value of $G_1$ within the range in which the output of the differential amplifier 26 is not saturated, the input offset voltage can be minimized to achieve both a compensation of the input offset voltage, and a sampling and holding of the analog input signal.

Since this comparator is constructed of differential amplifiers, moreover, it has such an excellent common-mode rejection ratio with respect to both the signal as well as the power supply voltage that it is suitable for use in the A/D converter of the present invention.

Consider the case in which the line 20 is biased by $\frac{1}{2} V_{REF}$ from the D/A converter, as shown in FIG. 4. If the resistance of the series network of the D/A converter is low, the connection of the bus and the $\frac{1}{2} V_{REF}$ point would have little effect. If the resistance is high, however, a bias is desired through a buffer amplifier 19 with a follower connection which has a voltage gain of one, as shown in FIG. 4, so as to prevent any mutual interference between the D/A converter and the comparator.

Figure 5:
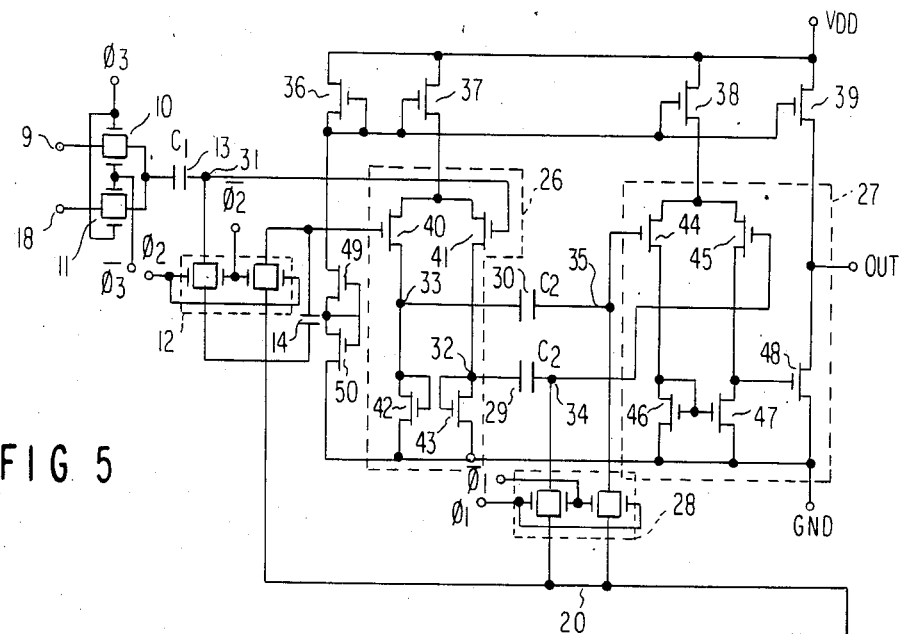
FIG. 5 is a circuit diagram of detailed example of the sample-and-hold circuit and the comparator.

FIG. 5 is a circuit diagram of the case in which the embodiment of FIG. 4 is fabricated by a CMOS construction. As shown, the differential amplifier 26 is constructed of P-channel transistors 40 and 41 and N-channel transistors 42 and 43, and the differential amplifier 27 is constructed of P-channel transistors 44 and 45 and N-channel transistors 46, 47 and 48. The bias circuit for supplying a constant current to these amplifiers is constructed of P-channel transistors 36, 37, 38, 39 and 49 and an N-channel transistor 50.

According to the CMOS construction, the switches 10 and 11 can be turned securely by any analog signal between zero to the power supply voltage, without the use of a bootstrap circuit.

The buffer amplifier 19 is constructed of P-channel transistors 51, 52, 53, 54, 55, 56, 57 and 64, N-channel transistors 58, 59, 60, 61, 62, 63 and 65 and a phase-compensating capacitor 66.

According to the present invention, as has been described above, it is possible to provide a MOS D/A converter which can operate with a single power supply, and also an A/D converter which samples and holds an analog input signal to convert the analog input signal into a digital signal, for a wide range of input signals between zero and the power supply voltage and which has excellent characteristics, even when there are fluctuations in the power supply voltage, so that it is suitable for use in a monolithic semiconductor device.

I claim:

1. A digital to analog converter comprising a first folded resistor string circuit having first and second longitudinal resistor portions spaced apart from each other in parallel, a second folded resistor string circuit having third and fourth longitudinal resistor portions spaced apart from each other in parallel said first and second longitudinal resistor portions defining a first area therebetween, said third and fourth resistor portions defining a second area therebetween, means for interconnecting one end of each of said first and second resistor string circuits to thereby connect said first to fourth longitudinal resistor portions in series, means for applying a first voltage to the other end of said first resistor string circuit, means for applying a second voltage to the other end of said second resistor string circuit, said first to fourth having a plurality of voltage divider terminals, a plurality of output lines, a plurality of first field effect transistors of a first conductivity type coupled between the voltage divider terminals of said first resistor portion and said output lines a plurality of second field effect transistors of said first conductivity type coupled between the voltage divider terminals of said second resistor portions and said output line, said first and second transistors being formed on said first area in parallel, a plurality of third field effect transistors of a second conductivity type coupled between the voltage divider terminal of said third resistor portion and said output lines a plurality of fourth field effect transistors of said second conductivity type coupled between the voltage divider terminals of said fourth resistor portion and said output lines, said third and fourth transistors being formed on said second area in parallel, and means responsive to digital information for selectively rendering said first and second transistors conductive, no transistors being formed on an area between said second and third resistor portions.

2. A digital to analog converter comprising; a first series circuit of resistors arranged in a longitudinal direction, a second series circuit of resistors arranged in said longitudinal direction, said first and second series circuits defining a first area therebetween, means for applying a first voltage to one end of said first series circuit, means for connecting the other end of said first series circuit to one end of said second series circuit, a third series circuit of resistors arranged in said longitudinal direction, a fourth series circuit of resistors arranged in said longitudinal direction, said third and fourth series circuits defining a second area therebetween, means for connecting one end of said fourth series circuit to a second voltage, means for connecting the other end of said fourth series circuits to one end of said third series circuit, means for interconnecting the other ends of said second and third series circuits, a plurality of output lines, a plurality of first field effect transistors of a first conductivity type formed on said first area, each of said first transistors being coupled between a respective one of said output lines and a respective one of the intermediate junctions between two series connected resistors of said first series circuit, a plurality of second field effect transistors of said first conductivity type formed on said first area, each one of said second transistors being coupled between a respective one of said output lines and a respective one of the intermediate junctions between two series connected resistors of said second series circuit, a plurality of third field effect transistors of a second conductivity type formed on said second area, each of said third transistors being coupled between a respective one of said output lines and a respective one of the intermediate junctions between two series connected resistors of said third series circuit, a plurality of fourth field effect transistors of said second conductivity type formed on said second area, each of said fourth transistors being coupled between a respective one of said output lines and a respective one of the intermediate junctions between two series connected resistors of said fourth series circuit said second and third series circuits being adjacent each other and no transistor being formed on an area between said second and third series circuits, first to fourth control lines coupled to gates of said first to fourth transistors, respectively, and means responsive to a digital signal for controlling said control lines to selectively render said first to fourth transistors either conducting or non-conducting.

3. The digital to analog converter according to claim 2, in which said first transistors and second transistors are arranged in parallel, and said third and fourth transistors are arranged in parallel.

4. The converter according to claim 2, in which said first and second areas are arranged in parallel.

* * * * *